United States Patent [19]
Puzzo

[11] Patent Number: 5,168,215
[45] Date of Patent: Dec. 1, 1992

[54] INSTANTANEOUS FREQUENCY MEASUREMENT APPARATUS AND METHOD

[75] Inventor: Dean C. Puzzo, Merrimack, N.H.

[73] Assignee: Lockheed Sanders, Inc., Nashua, N.H.

[21] Appl. No.: 792,973

[22] Filed: Nov. 15, 1991

[51] Int. Cl.$^5$ .............................. G01S 7/36; G01S 7/42
[52] U.S. Cl. .................. 324/78 F; 324/77 G; 324/78 Z; 342/99; 342/18; 367/90; 455/204; 455/216
[58] Field of Search ............... 324/78 R, 78 E, 78 F, 324/77 G, 77 H, 79 R; 342/18, 20, 28, 108, , 98, 116, 99; 367/90, 94; 455/47, 67, 71; 375/113

[56] References Cited

U.S. PATENT DOCUMENTS

| | | | |
|---|---|---|---|
| 3,634,766 | 1/1972 | Boyer | 455/216 |
| 4,035,799 | 7/1977 | Hsiao | 342/194 |
| 4,053,882 | 10/1977 | Vanetten | 342/194 |
| 4,423,519 | 12/1983 | Bennett | 324/78 F |

Primary Examiner—Kenneth A. Wieder
Assistant Examiner—Jose M. Solis
Attorney, Agent, or Firm—David W. Gomes

[57] ABSTRACT

An apparatus and method for measuring the frequencies of a pair of signals simultaneously present in a composite signal, comprising the steps of includes components for squaring the composite signal, filtering the squared signal for separating a first pass band and a higher frequency second pass band, instantaneously measuring the frequencies of the first and second pass bands and determining the individual frequencies of the pair of signals from the measured frequencies of the first and second pass bands.

14 Claims, 3 Drawing Sheets

INSTANTANEOUS FREQUENCY MEASUREMENT APPARATUS AND METHOD

BACKGROUND OF THE INVENTION

1. Cross References

The present application is related to the co-pending application of Dean C. Puzzo entitled "Transmission Signal Direction Finding Apparatus and Method", filed on even date herewith.

2. Field of the Invention

This invention generally relates to the instantaneous measurement of signal frequencies and particularly to apparatuses and methods for instantaneous frequency measurement which are capable of operation when more than one signal is simultaneously present.

3. Statement of the Prior Art

Devices for the instantaneous measurement of signal frequencies, IFMs, have been known and used for some time. Unfortunately, such devices are limited in their measurement ability when more than one signal frequency is present. When two signal frequencies are present and their respective signal powers are within (6) dB of each other, an IFM generally cannot measure the frequency of either signal. When two signal frequencies are present and their respective signal powers differ by more than (6) dB, an IFM can measure the frequency of the higher power signal but cannot measure the frequency of the lower power signal.

SUMMARY OF THE INVENTION

Accordingly, the present invention provides an apparatus for instantaneously measuring the frequencies of a pair of signals simultaneously present in a composite signal, comprising means for squaring the composite signal, means for filtering the squared signal for separating a first pass band and a higher frequency second pass band, means for instantaneously measuring the frequencies of the first and second pass bands, and means for determining the individual frequencies of the pair of signals from the measured frequencies of the first and second pass bands. In a refinement, the present invention also provides means for detecting the filtered first pass band for determining the presence of more than one signal.

The present invention also provides a method for measuring the frequencies of a pair of signals simultaneously present in a composite signal, comprising the steps of squaring the composite signal, filtering the squared signal for separating a first pass band and a higher frequency second pass band, instantaneously measuring the frequencies of the first and second pass bands, and determining the individual frequencies of the pair of signals from the measured frequencies of the first and second pass bands.

BRIEF DESCRIPTION OF THE DRAWINGS

The present invention is illustratively described below in reference to the accompanying drawings in which.

DETAILED DESCRIPTION OF THE DRAWINGS

Figure 1:
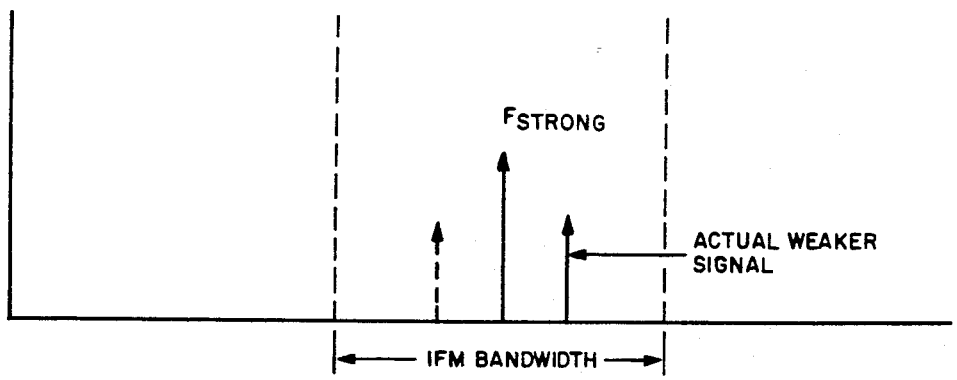
FIG. 1 is a graph of two simultaneously present signals.

It is generally accepted that a single frequency IFM (instantaneous frequency measurement) device, yields corrupted data on a primary signal if another signal is present which is within (6) dB in power of the primary signal. This results in the loss of information on both signals. FIG. 1 shows the typical situation in which two signals $f_1, f_2$ are present within the operating bandwidth of an IFM.

The waveform resulting from FIG. 1 can be defined mathematically as $$x(t) = A_1 \cos(w_1 t) + A_2 \cos(w_2 t) \tag{1}$$

where
- $A_1$ = amplitude of signal
- $A_2$ = amplitude of signal 2
- $w_1$ = frequency of signal $1 = 2\pi f_1$
- $w_2$ = frequency of signal $1 = 2\pi f_1$ The operation of the present invention is based upon the use of the intermodulation products derived from coupling the signal defined by eqn. 1 through a squarer. The mathematical representation of the squared signal which is outputted is:

$$Y(t) = [x(t)]^2 \tag{4}$$

Substituting eqn. (1) into eqn. (4) yields $$Y(t) = (A_1 \cos w_1 t + A_2 \cos w_2 t)^2 \tag{5}$$

Expanding the right side of eqn. (5) yields $$Y(t) = A_1^2 \cos^2 w_1 t + A_2^2 \cos^2 w_2 t + 2A_1 A_2 \cos(w_1 t)\cos(w_2 t) \tag{6}$$

Using the following identities:

$$\cos^2 w_1 t = \tfrac{1}{2}[1 + \cos 2w_1 t] \tag{7}$$

$$\cos^2 w_2 t = \tfrac{1}{2}[1 + \cos 2w_2 t] \tag{8}$$

$$2\cos(w_1 t)\cos(w_2 t) = \cos(w_1 + w_2)t + \cos(w_1 - w_2)t \tag{8}$$

$$2\cos(w_1 t)\cos(w_2 t) = \cos(w_1 + w_2)t + \cos(w_1 + w_2)t \tag{9}$$

substituting into eqn. (6) yields $$Y(t) = x^2(t) = \tag{10}$$

$$\frac{|A_1|^2}{2} + \frac{|A_2|^2}{2} + \frac{|A_1|^2}{2}\cos(2w_1 t) + \frac{|A_2|^2}{2}\cos(2w_2 t) +$$

$$A_1 A_2 \cos(w_1 + w_2)t + A_1 A_2 \cos(w_1 - w_2)t$$

We can now define 3 subbands such that $$Y_L(t) = \frac{|A_1|^2}{2} + \frac{|A_2|^2}{2} \tag{11}$$

$$Y_m(t) = A_1 A_2 \cos(w_1 - w_2)t \tag{12}$$

-continued $$Y_H(t) = \frac{|A_1|^2}{2} \cos(2w_1 t) + \frac{|A_2|^2}{2} \cos(2w_2 t) + A_1 A_2 \cos(w_1 + w_2)t \qquad (13)$$

$Y_L(t)$ represents the D.C. components which indicate the total power of the two waveforms. $Y_M(t)$ represents the difference frequency component $w_1 - w_2$. $Y_H(t)$ has three contributors at frequencies $2w_1$, $2w_2$ and $w_1 + w_2$.

The lower cutoff frequency of the band pass filter cannot be zero because it must be able to filter out the DC terms. This now puts a limit on the minimum frequency of $w_1 - w_2$ or how close the two frequencies can be.

The signals typically received for frequency measurement comprise pulsed signals which have a pulse width in time of Tp. As a result of this, the lower cutoff frequency for Ym(t) is typically limited to 1/Tp.

Of interest is $w_1 + w_2$, which is the dominant term for less than a six dB difference in the two input signals. If the two signal powers are within 6 dB of each other, and assuming that we will hard limit both $Y_M(t)$ and $Y_H(t)$, then the dominant sum term, $w_1 + w_2$, is further enhanced and equation (13) becomes $$Y_H(t) = A_1 A_2 \cos(w_1 + W_2)t \qquad (14)$$

Note from equation (12) that the difference information, $w_1 - w_2$, is always separable, independent of relative signal amplitudes, because its frequency component is filterable. However, the sum information from equation (13) is only attainable if the signal powers are within 6dB. This is because either the $A_1(2w_1)$ or $A_2(2w_2)$ component, having frequencies comparable to the $A_1 A_2(w_1 + W_2)$ component, will have an amplitude comparable to the $A_1 A_2(w_1 + w_2)$ component if the signal powers differ by more than (6) dB.

Figure 2:
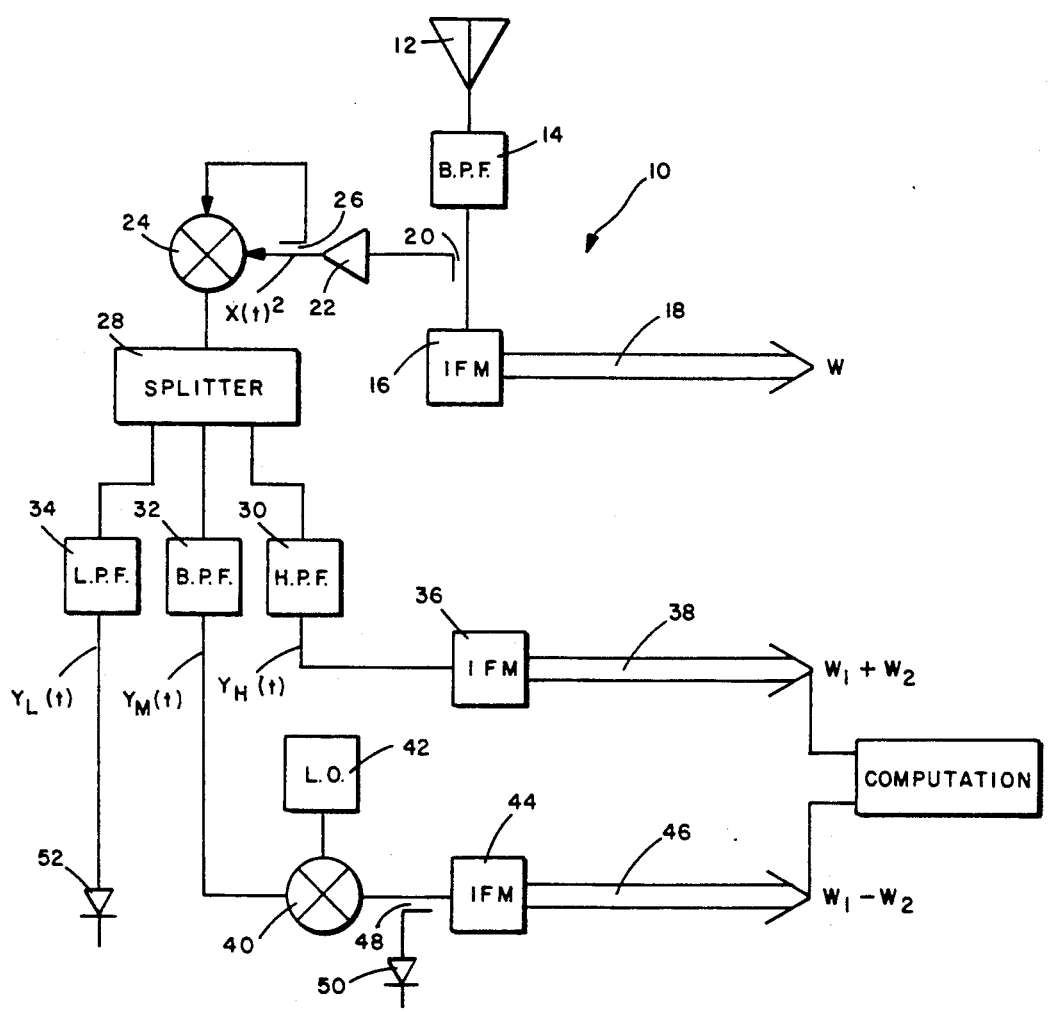
FIG. 2 is a schematic block diagram of an apparatus constructed in accordance with one embodiment of the present invention.

The basic functioning of the present invention can be described in reference to FIG. 2 which shows a frequency measurement receiver 10. It is somewhat common for transmission signals having different frequencies to be present in the atmosphere and to be received by a single receiver. Depending upon the relative location of the signal origins and the receiving antenna, the relative power between the received signals can easily be within 6dB.

The system 10 receives both signals simultaneously with an antenna 12. The output of antenna 12 is coupled through a bandpass filter 14 which typically corresponds to the bandwidth of interest for frequency measurement. The output of the bandpass filter 14 is directly coupled to a first IFM 16 for those situations in which only a single transmission signal is present. When such is the case, IFM 16 is capable of outputting a digital signal on databus 18 representing the frequency of the received signal.

A coupler 20 is used to tap off some of the received signal for those cases when two transmission signals are simultaneously present. This coupled signal is amplified by a linear amplifier 22 and thereafter connected to a squarer 24. In one embodiment, the squarer 24 is a double balanced mixer, DBM, which derives both of its inputs from amplifier 22, a first input directly and a second input from a partial coupler 26.

The output of squarer 24 is connected to a power splitter 28 which splits the power between three bandpass filters 30 32,34. Bandpass filter 30 passes only the high frequency signal $Y_H(t)$ represented by eqn. (13). The output of bandpass filter is connected directly to a second IFM 36 which outputs a digital signal on a databus 38 representing $w_1 + w_2$.

The second bandpass filter 32 separates the middle portion of the signal, $Y_M(t)$, represented by eqn. (12). The output of bandpass filter 32 is coupled through a mixer 40, connected to a local oscillator 42, which shifts the frequency of the middle band signal into the operating range of a third IFM 44. IFM 44 outputs a digital signal on bus 46 which represents the difference frequency $w_1 - w_2$ added to the frequency of local oscillator 42. The difference frequency is thereafter readily derived by simply subtracting the frequency of local oscillator 42.

A portion of the middle band signal is also decoupled by a decoupler 48 and connected to a log video detector 50. The output of detector 50 is used to signal when more than one signal is present. Because band pass filter 32 is adapted to block frequencies that would singularly be present in the pass band of filter 14, the only signals that filter 32 will pass are intermodulation products having a difference frequency from more than one transmission signal being present in the pass band of filter 14. For this reason, the output of detector 50 is a direct indicator of the presence of more than one transmission signal.

The use of low pass filter 34 is optional to the present invention. Its output is connected directly to a second log video detector 52 which indicates the presence of the $Y_L(t)$ signal from eqn. (11) and, therefore, the presence of one or more received transmission signals. Detector 50 and 52 can be used to indicate the condition of one signal present, thus when the circuit should use IFM 16. In combination with detector 50 an indication is also given of the presence of two transmission signals whose frequencies differ by less than the highest pass frequency of filter 34.

The computational steps required by this embodiment may be performed by any suitable computational means 54 such as a dedicated or programmable computer. For this purpose, each of the databuses 18,38,46 are connected to computational means 54 along with the outputs of detectors 50,52 which indicate to computational means 54 which data signals to use.

An example of frequency values which might be used for the circuit of FIG. 2 are as follows:
band pass filter 14—2 to 4GHz;
IFMs 16,44—2 to 4GHz;
high pass filter 30—4 to 8GHz;
band pass filter 32—30MHz to 2GHz;
low pass filter 34—D.C. to 30MHz;
IFM 36—4 to 8GHz; and
local oscillator 42—2GHz.

Figure 3:
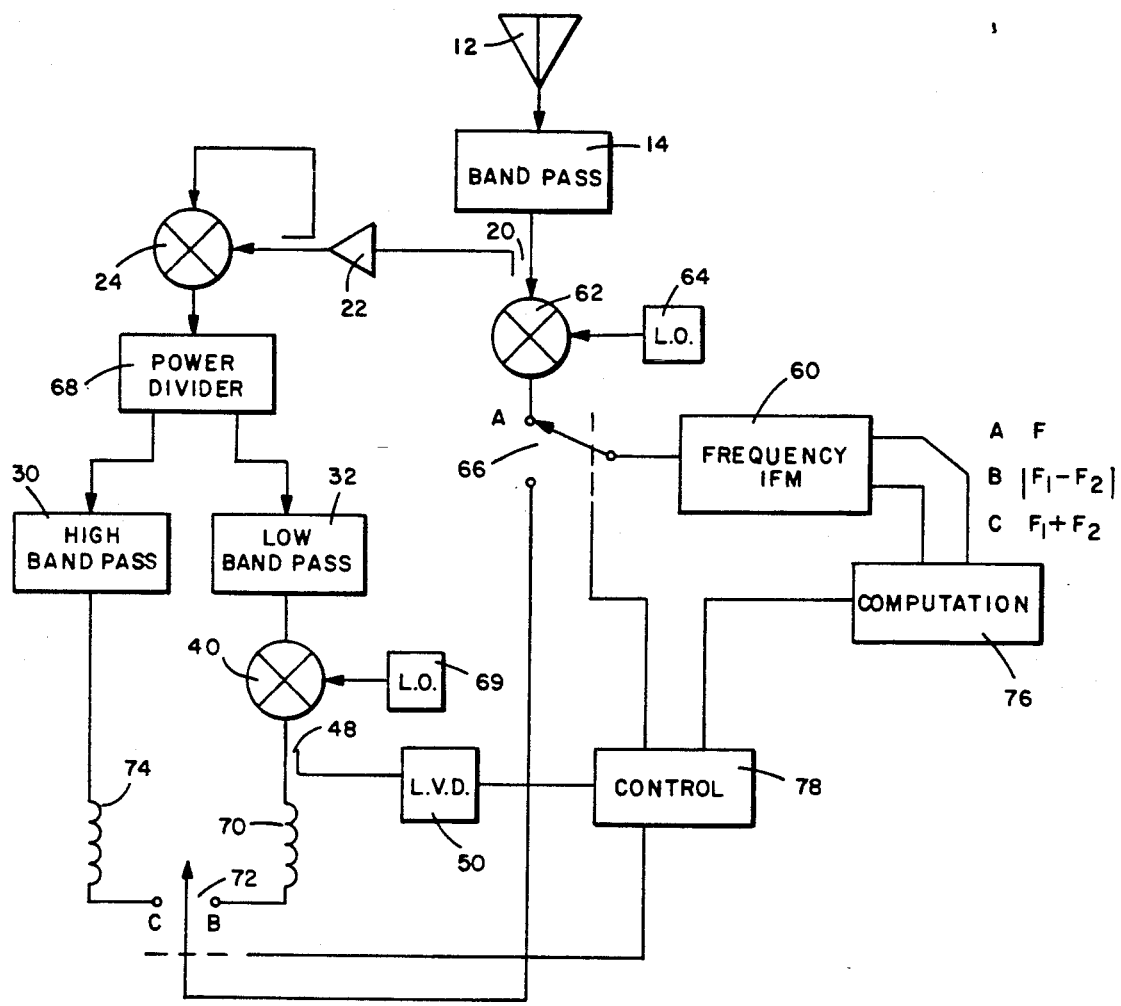
FIG. 3 is a schematic block diagram of an apparatus constructed in accordance with another embodiment of the present invention.

FIG. 3 is an alternate embodiment of the present intention wherein those components having the identical form and function as components in FIG. 2 bear the same identification number. The purpose of the FIG. 3 embodiment is to make use of a single IFM 60 to singularly measure all of the frequency components present in a time multiplex manner.

The direct output of band pass filter 14 is connected to a mixer 62 which is also coupled to a local oscillator 64. Mixer 62 raises the frequencies of received signals to the operating bandwidth of IFM 60. The output of mixer 62 is connected to the input of a switch 66 for multiplexing to IFM 60.

The output of squarer 24 is coupled to a two channel power divider 68 which distributes the signal to just the high and middle band filters 30,32. The output of filter 32 is again coupled to a mixer 40 for frequency shifting. A local oscillator 69 provides the shifting frequency to another input of mixer 40.

The output of mixer 40 is likewise detected by a coupler 48 and detector 50; however, from here the signal is coupled to a delay line 70 and thereafter to one input of a multiplexing switch 72. The output of high pass filter 30 is similarly coupled through a delay line 74 to another input of switch 72. The delay lines are set for different values so that the middle and high frequency signals $Y_M(t), Y_H(t)$ can be time multiplexed into IFM 60. The output of switch 72 is connected to another input of switch 66, the output of which inputs signals to IFM 60.

In operation the received signal is coupled through mixer 62 to IFM 60 and through the squarer 24 and its associated circuitry. The detector 50 is used to determine the presence of more than one transmission signal and causes switches 72 and 66 to multiplex $Y_M(t)$ and $Y_H(t)$ to IFM 60 for additional measurements. Delay lines 70,74 cause all three IFM measure signals to arrive at the IFM at different points in time Computational circuitry 76 may then be used in the manner described below to use one, two or all three of the measured frequencies to determine the transmission signal frequencies. The use of a single IFM is thereby enabled through the use of the delay lines 70,74, multiplexer switches 66,72 and mixers 62,40.

All of the measurements taken by IFM 60 are outputted therefrom in digital form on a databus 76 to a suitable computational means 76. Computational means 76 is signalled about the arrival of data on databus 76 by a control means 78. Control means 78 is also connected to receive the indication of detector 50 and to control the operation of multiplexing switches 66,72. Control means 78 may be effected in any suitable manner such as with a dedicated or programmable computer to perform control functions in accordance with the operational features described herein.

An example of frequency values which might be used for the circuit of FIG. 3 are as follows:
 band pass filter 14—2 to 4GHz;
 IFMs 60—4 to 8GHz;
 high pass filter 30—4 to 8GHz;
 band pass filter 32—30MHz to 2GHz;
 delay line 70—100 nanoseconds;
 delay line 70—200 nanoseconds;
 local oscillator 69—4GHz; and
 local oscillator 64—2GHz.

The apparatuses described above can be used for frequency measurement in a variety of situations including the presence of either one frequency or two frequencies. More than one frequency can be measured regardless of whether the amplitudes are within or not within (6) dB of each other. When just a single frequency signal is present, the output of IFM 18 of FIG. 2 and the first measurement of IFM 60 of FIG. 3 can be used to find the frequency. In FIG. 3, the frequency of local oscillator 64 must be subtracted from the measurement.

When two signals are present, the circuits function as described to produce the sum, $w_1+w_2$, and difference $|w_1-w_2|$, signals. The signal frequencies may then be determined by halving the sum to find the average and then adding and subtracting half of the difference to find the two frequencies. As with the single frequency measurement of FIG. 3, any local oscillator frequencies used for shifting the measured frequency must be subtracted prior to computation.

In the situation where two signals are present but are separated in amplitude by more than (6) dB, the described embodiment will measure the frequency of the stronger signal and also the difference frequency $|w_1-w_2|$. Because the polarity of the difference frequency is not known, it may not be possible to determine for certain the frequency of the weaker signal However, certain signal situations may enable this determination.

Figure 4:
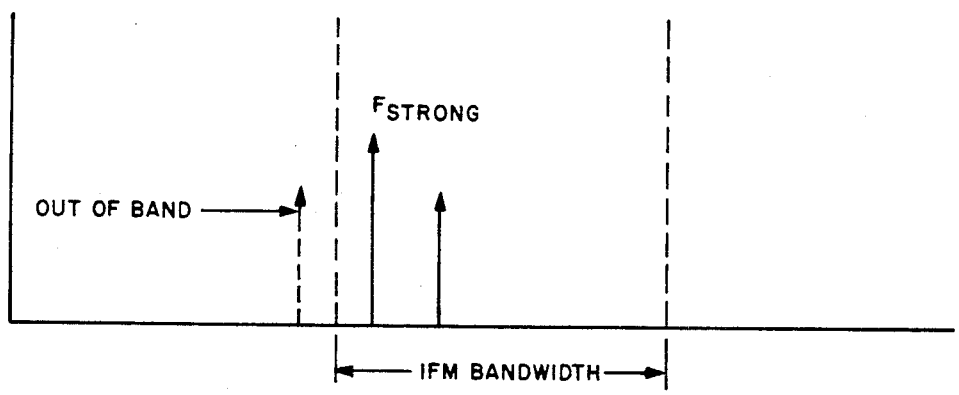
FIGS. 4 and 5 are graphs of special cases of simultaneously present signals which may be measured by the described embodiments.
Figure 5:
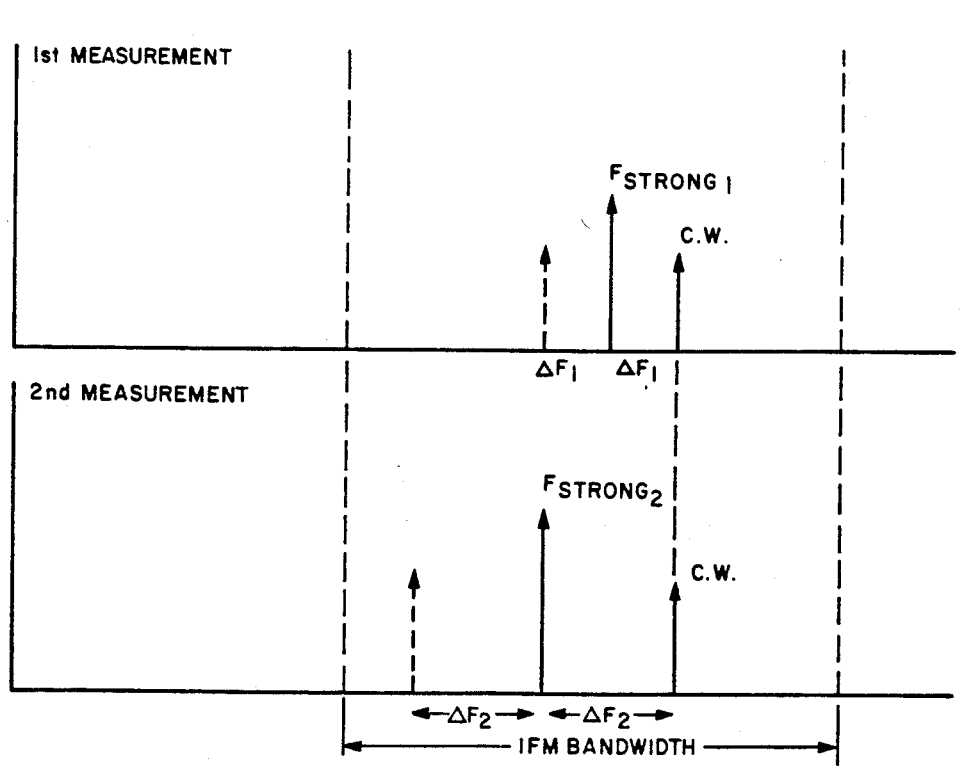

FIGS. 4 and 5 are plots of certain signal situations in which the frequency of a signal more than (6) dB lower than a stronger signal can be measured without knowing the polarity of the difference signal $|w_1-w_2|$. FIG. 4 shows the situation in which the frequency difference between the strong signal $F_s$ and the edge of the IFM bandwidth is less than the difference between $F_s$ and the weak signal $F_u$. FIG. 5 shows the situation where a weak continuous wave signal $F_{cw}$ is present during the occurrence of more than one stronger pulsed signal $F_{s1}, F_{s2}$. In this case, two strong signal readings $s_1, F_{s2}$ and two difference signal readings $F_{s1}-F_{cw}$, $F_{s2}-F_{cw}$ are provided which logically allow the determination of the proper frequency for $F_{cw}$.

The embodiments described above are intended to be taken in an illustrative and not a limiting sense. Various modifications and changes may be made to the above embodiments by present skilled in the art without departing from the scope of the present invention as defined in the appended claims.

What is claimed is:

1. An apparatus for measuring the frequencies of a pair of signals simultaneously present in a composite signal, comprising:
 means for squaring the composite signal;
 means for filtering the squared signal for separating a first pass band and a higher frequency second pass band;
 means for instantaneously measuring the frequencies of the first and second pass bands; and the pair of signals from the measured frequencies of the first and second pass bands.

2. The apparatus of claim 1 wherein the means for determining includes computational means having means for halving the frequency measured for the second pass band for determining the average frequency of the pair of signals and means for respectively adding and subtracting half of the frequency measured for the first pass band to the average frequency for computing the individual frequencies of the pair of signals.

3. The apparatus of claim 1, wherein the means for squaring includes a double balanced mixer having two inputs coupled to receive the composite signal.

4. The apparatus of claim 1, further comprising means for detecting the filtered first pass band for determining the presence of more than one signal.

5. The apparatus of claim 4, further comprising: second means for filtering the squared signal for separating a third pass band having a lower frequency than the first pass band; and second means for detecting the third pass band for determining the presence of any signal.

6. The apparatus of claim 1, wherein the means for instantaneously measuring includes an IFM device and multiplexing means for sequentially coupling the first and second filtered pass bands to the IFM device including means for delaying one of the first and second pass bands for distinguishing the pass bands in time.

7. The apparatus of claim 6, wherein the multiplexing means includes second means for sequentially coupling the composite signal to the IFM device along with the first and second pass bands including second means for delaying the other of the first and second pass bands for distinguishing the pass bands in time from the composite signal.

8. A method for measuring the frequencies of a pair of signals simultaneously present in a composite signal, comprising the steps of:
   squaring the composite signal;
   filtering the squared signal for separating a first pass band and a higher frequency second pass band;
   instantaneously measuring the frequencies of the first and second pass bands; and
   determining the individual frequencies of the pair of signals from the measured frequencies of the first and second pass bands.

9. The method of claim 8 wherein the step of determining includes the steps of determining the average frequency of the pair of signals by halving the frequency measured for the second pass band and computing the individual frequencies of the pair of signals by respectively adding and subtracting half of the frequency measured for the first pass band to the average frequency.

10. The method of claim 8, wherein the step of squaring includes coupling the composite signal to both inputs of a double balanced mixer.

11. The method of claim 8, further comprising the step of determining the presence of more than one signal by detecting the filtered first pass band.

12. The method of claim 11, further comprising: the steps of filtering the squared signal for separating a third pass band having a lower frequency than the first pass band; and detecting the third pass band for determining the presence of any signal.

13. The method of claim 8, wherein the step of instantaneously measuring includes sequentially coupling the first and second filtered pass bands to an IFM device including delaying one of the first and second pass bands for distinguishing the pass bands in time.

14. The method of claim 13, wherein the step of instantaneously measuring also includes sequentially coupling the composite signal to the IFM device along with the first and second pass bands including delaying the other of the first and second pass bands for distinguishing the pass bands in time from the composite signal.

* * * * *